(12) United States Patent
Sakurayama

(10) Patent No.: US 11,382,247 B2
(45) Date of Patent: Jul. 5, 2022

(54) MOUNTING DEVICE, DETECTION DEVICE, AND DETECTION METHOD

(71) Applicant: FUJI CORPORATION, Chiryu (JP)

(72) Inventor: Takeshi Sakurayama, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 41 days.

(21) Appl. No.: 16/955,109

(22) PCT Filed: Dec. 19, 2017

(86) PCT No.: PCT/JP2017/045468
§ 371 (c)(1),
(2) Date: Jun. 18, 2020

(87) PCT Pub. No.: WO2019/123527
PCT Pub. Date: Jun. 27, 2019

(65) Prior Publication Data
US 2020/0315075 A1    Oct. 1, 2020

(51) Int. Cl.
*H05K 13/02*  (2006.01)
*H05K 13/04*  (2006.01)
*H05K 13/08*  (2006.01)

(52) U.S. Cl.
CPC ......... *H05K 13/02* (2013.01); *H05K 13/0419* (2018.08); *H05K 13/08* (2013.01)

(58) Field of Classification Search
CPC ..... H05K 13/02; H05K 13/0419; H05K 13/08
See application file for complete search history.

(56) References Cited

U.S. PATENT DOCUMENTS

| 8,595,918 B2 * | 12/2013 | Jindo | H04N 5/2355 29/709 |
| 9,036,022 B2 * | 5/2015 | Tsuboi | H05K 13/0413 348/86 |
| 10,420,267 B2 * | 9/2019 | Kanai | H05K 13/0408 |

(Continued)

FOREIGN PATENT DOCUMENTS

| JP | 3339213 B   * 10/2002 |
| JP | 2010-50338 A   3/2010 |

(Continued)

OTHER PUBLICATIONS

International Search Report dated Feb. 13, 2018 in PCT/JP2017/045468 filed Dec. 19, 2017, 2 pages.

*Primary Examiner* — Carl J Arbes
(74) *Attorney, Agent, or Firm* — Oblon, McClelland, Maier & Neustadt, L.L.P.

(57) ABSTRACT

A mounting device, comprising: a mounting section on which a feeding unit is installed to supply components by feeding a packaging member where the components are packaged at predetermined intervals; a mounting head configured to pick up a component from the packaging member; an imaging section configured to image the packaging member; and a control section configured to obtain a packaging pitch based on a reference pattern of the packaging member with the packaged components, the reference pattern being acquired based on a pre-pickup image which is a captured image of the packaging member before picking up a component, and a post-pickup image which is a captured image of the packaging member after picking up the component.

10 Claims, 6 Drawing Sheets

(56) References Cited

U.S. PATENT DOCUMENTS

| | | | |
|---|---|---|---|
| 2003/0123755 A1* | 7/2003 | Shimizu | G06T 7/73 |
| | | | 382/291 |
| 2016/0029521 A1 | 1/2016 | Mori et al. | |
| 2017/0049013 A1* | 2/2017 | Kanai | H05K 13/0408 |

FOREIGN PATENT DOCUMENTS

| | | |
|---|---|---|
| JP | 2010-171208 A | 8/2010 |
| JP | 2016-31959 A | 3/2016 |

* cited by examiner

MOUNTING DEVICE, DETECTION DEVICE, AND DETECTION METHOD

TECHNICAL FIELD

In this specification, a mounting device, a detection device, and a detection method are disclosed.

BACKGROUND ART

Conventionally, there has been proposed a mounting device in which a tape with packaging components at predetermined intervals is imaged, and a recognition process is performed so as to measure the pitch of the component accommodating portions (for example, see Patent Literature 1 and 2). In the mounting device of Patent Literature 1, when the measured pitch differs from library data, a notification that there is an abnormality is sent out. Further, in the mounting device of Patent Literature 2, a tape is intermittently fed with changing a feed pitch from a predetermined feed pitch to a measured pitch. In these devices, the feed pitch of the component storing tape can be aligned with the component suction position.

Patent Literature

Patent Literature 1: JP-A-2010-171208
Patent Literature 2: JP-A-2016-31959

BRIEF SUMMARY

Technical Problem

However, in the devices of Patent Literature 1 and 2 described above, depending on the captured image, there are cases in which the component packaging pitch is erroneously recognized because of its difficulty in determining which region is a component accommodating portion or tape and which region is the component region. If the packaging pitch is erroneously recognized, a large number of components that cannot be used in the mounting process are likely to be produced, and therefore, there has been demand to obtain the component packaging pitch more reliably in the mounting device.

The present specification has been made in view of such a problem, and it is a main object of the present disclosure to provide a mounting device, a detection device, and a detection method that obtains the component packaging pitch more reliably.

Solution to Problem

The mounting device, the detecting device, and the detecting method of the present disclosure adopt the following means to achieve the main object described above.

Mounting device disclosed in the present specification includes: a mounting section on which a feeding unit is installed to supply components by feeding a packaging member where the components are packaged at predetermined intervals; a mounting head configured to pick up a component from the packaging member; an imaging section configured to image the packaging member; and a control section configured to obtain a packaging pitch based on a reference pattern of the packaging member with the packaged components, the reference pattern being acquired based on a pre-pickup image which is a captured image of the packaging member before picking up a component, and a post-pickup image which is a captured image of the packaging member after picking up the component.

In this mounting device, the reference pattern of the packaging member packaged with components is acquired based on a pre-pickup image captured before a component is picked up and a post-pickup image captured after the component is picked up, and the packaging pitch of the components is obtained based on this reference pattern. In this mounting device, it is possible to detect the region of the component using a pre-pickup image and a post-pickup image, and since it is possible to more reliably determine the packaging position of the component, it is possible to more reliably obtain the packaging pitch of the component. Here, the "packaging member" is a tape or the like, and as examples of a packaging method, affixing components to the tape, accommodating components in accommodation portions in the tape, or the like can be cited.

DESCRIPTION OF EMBODIMENTS

Figure 1:
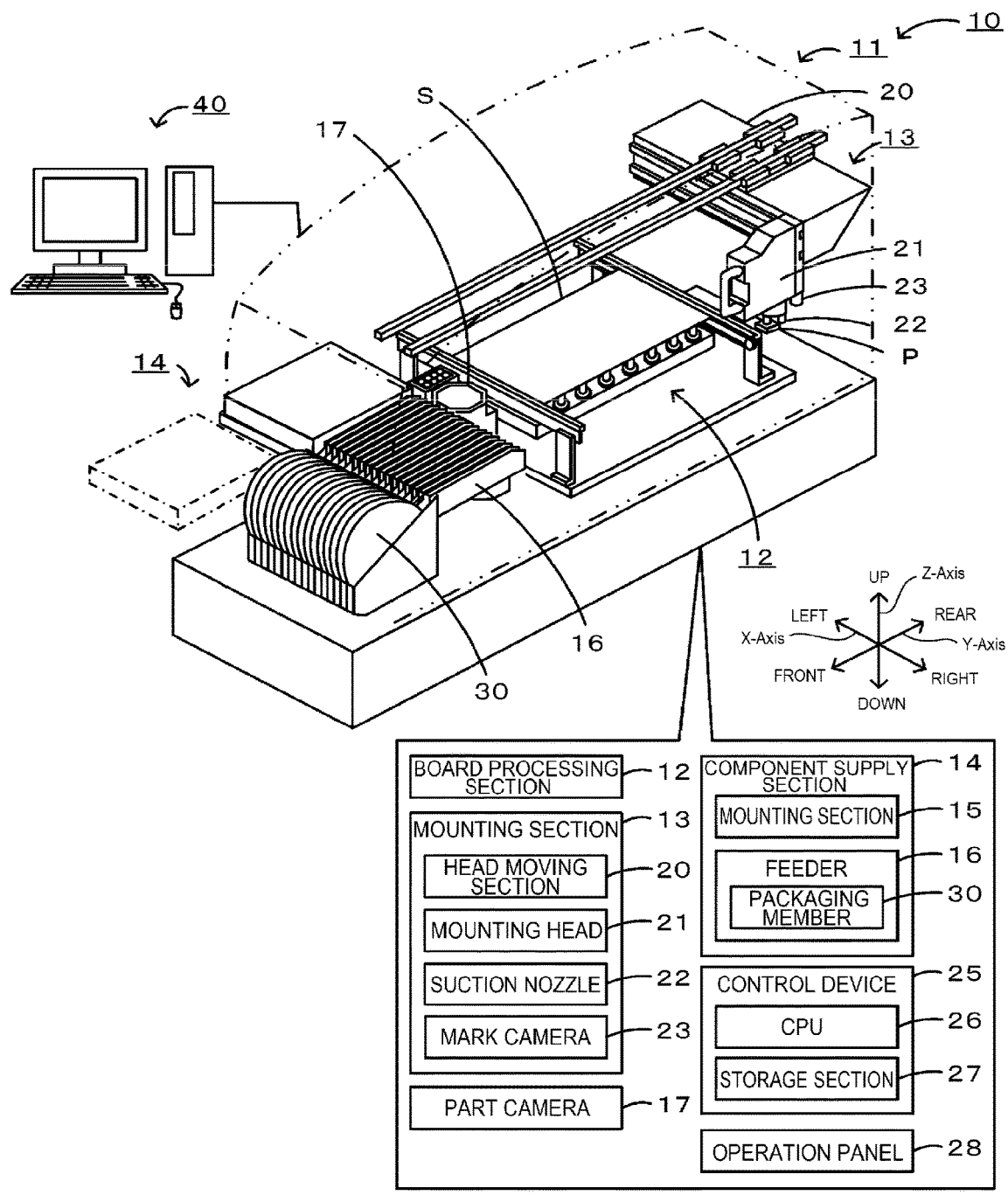
FIG. 1 A schematic diagram showing an example of mounting system 10.
Figure 2:
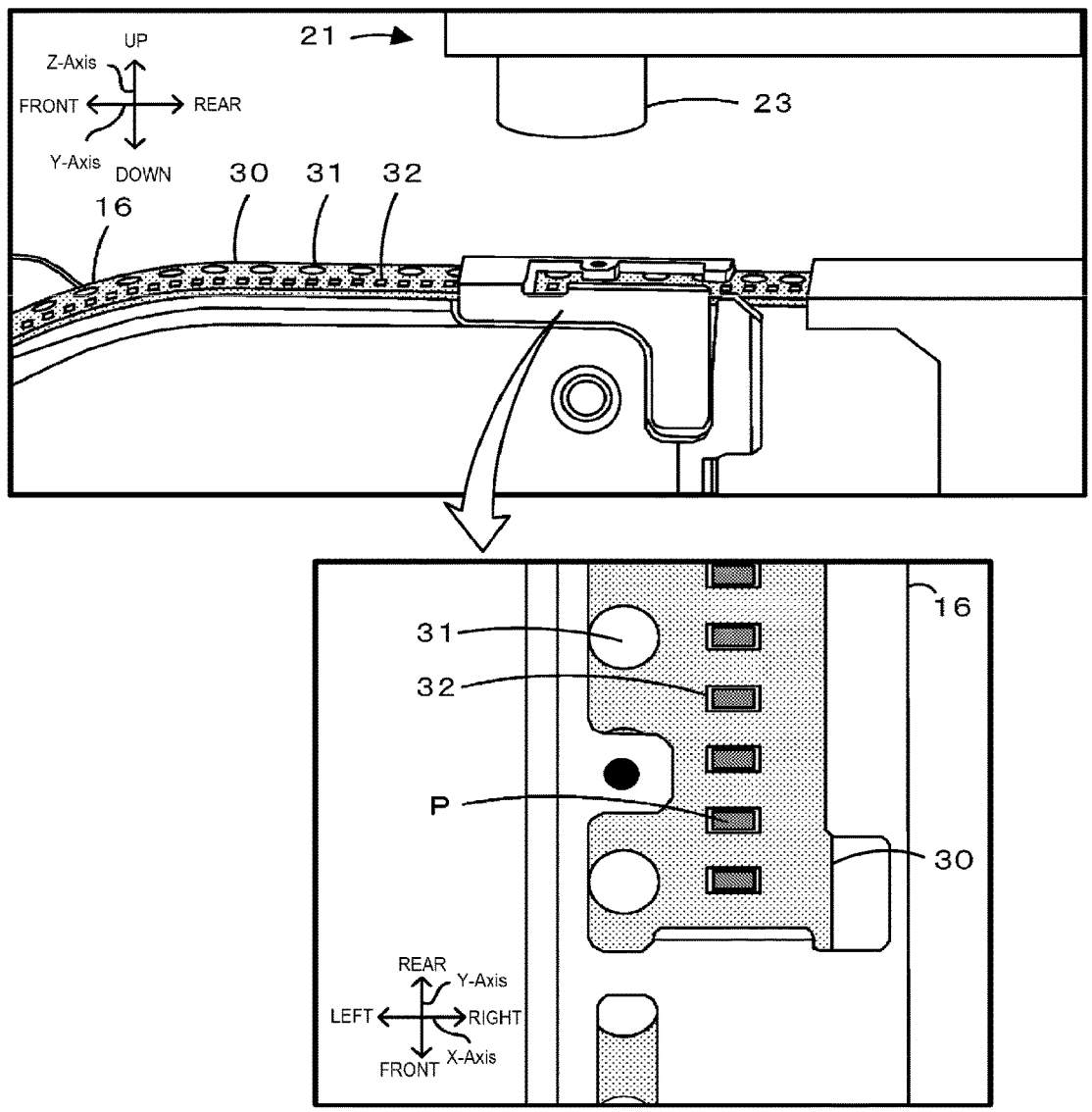
FIG. 2 A diagram of feeder 16 and packaging member 30.

The present embodiment will be described below with reference to the drawings. FIG. 1 is a schematic diagram of mounting system 10 that is an example of the present disclosure. FIG. 2 is a diagram of feeder 16 and packaging member 30. Mounting system 10 is, for example, a system that executes a process of mounting component P on board S. Mounting system 10 includes mounting device 11 and host computer (PC) 40. Mounting system 10 is configured as a mounting line in which multiple mounting devices 11 for mounting component P on board S are arranged from upstream to downstream. In FIG. 1, only one mounting device 11 is shown for convenience of explanation. In the present embodiment, the left-right direction (X-axis), the front-rear direction (Y-axis), and the up-down direction (Z-axis) are as shown in FIGS. 1 and 2.

Mounting device 11, as shown in FIG. 1, board processing section 12, mounting section 13, component supply section 14, part camera 17, control device 25, and operation panel 28. Board processing section 12 is a section for loading, conveying, and fixing board S at a mounting position, and carrying out board S. Board processing section 12 has a pair of conveyor belts spaced apart from each other in the front-rear direction of and suspended in the left-right direction of FIG. 1. Board S is conveyed by the conveyor belt.

Mounting section 13 is a section for placing component P picked up from component supply section 14 on board S secured to board processing section 12. Mounting section 13 includes head moving section 20, mounting head 21, and suction nozzle 22 (pickup member). Head moving section 20 includes a slider that is guided by guide rails and moves in the XY-direction and a motor that drives the slider. Mounting head 21 picks up multiple components P and is moved in the XY direction by head moving section 20. Mounting head 21 is detachably attached to the slider. One or more suction nozzles 22 are detachably attached to the lower face of mounting head 21. Multiple suction nozzles 22 for picking up component P can be attached to the circumference of mounting head 21. Suction nozzle 22 picks up a component using negative pressure. In addition to suction nozzle 22, component P may be picked up by a mechanical chuck or the like that mechanically holds component P. Mark camera 23 is disposed on the lower face of mounting head 21. Mark camera 23 moves in the XY direction together with the movement of mounting head 21, images the marks formed on board S, and also images the pickup position of component supply section 14.

Component supply section 14 is a section for supplying components P to mounting section 13 by feeding out packaging member 30 (e.g., tape, etc.) in which components are packaged at predetermined intervals (i.e., a packaging pitch). In component supply section 14, multiple feeders 16, each attached with a reel, are detachably attached to the front of mounting device 11 via mounting section 16. In each reel, packaging member 30 is wound, and multiple components P are packaged along the longitudinal direction of packaging member 30, As shown in FIG. 2, packaging member 30 has feed holes 31 and accommodating portions 32. The teeth of a sprocket disposed on feeder 16 are inserted into feed holes 31. Packaging member 30 is fed by rotational driving of the sprocket. Accommodating portions 32 are spaces in the tape in which components P are accommodated. As a method of packaging member 30 for packaging component P, component P may be attached to the surface of packaging member 30 instead of being accommodated in internal spaces. Packaging member 30 is unwound rearward from the reel, and is fed by feeder 16 to a pickup position where packaging member 30 is sucked by suction nozzle 22 while component P is exposed. Feeder 16 includes a controller (not shown). The controller stores the feed amount (i.e., a packaging pitch) of packaging member 30 and controls a drive motor of the sprocket.

Part camera 17, as shown in FIG. 1, is a device for capturing an image of one or more components P picked up and held by mounting head 21. Part camera 17 is disposed between component supply section 14 and board processing section 12. The imaging range of part camera 17 is above part camera 17. Part camera 17 captures one or two or more images when mounting head 21 holding component P passes above part camera 17 and outputs the captured images to control device 25. Control device 25 can detect whether component P has been picked up from packaging member 30 based on the captured image(s) of part camera 17.

Control device 25 is configured as a microprocessor centered on CPU 26, and includes storage section 27 and the like for storing various data. Control device 25 outputs control signals to board processing section 12, mounting section 13, component supply section 14, part camera 17, and operation panel 28, and receives signals from mounting section 13, component supply section 14, part camera 17, and operation panel 28. Storage section 27 stores mounting-condition information including placement sequences and placement positions in which components P are mounted on board S. Operation panel 28 receives input from an operator and reports information to the operator, and has a display and an operation section.

Host PC 40 is a computer for managing data of the devices of mounting system 10. Host PC 40 transmits mounting-condition information to mounting device 11 and receives mounting process results and the like from mounting device 11.

Figure 3:
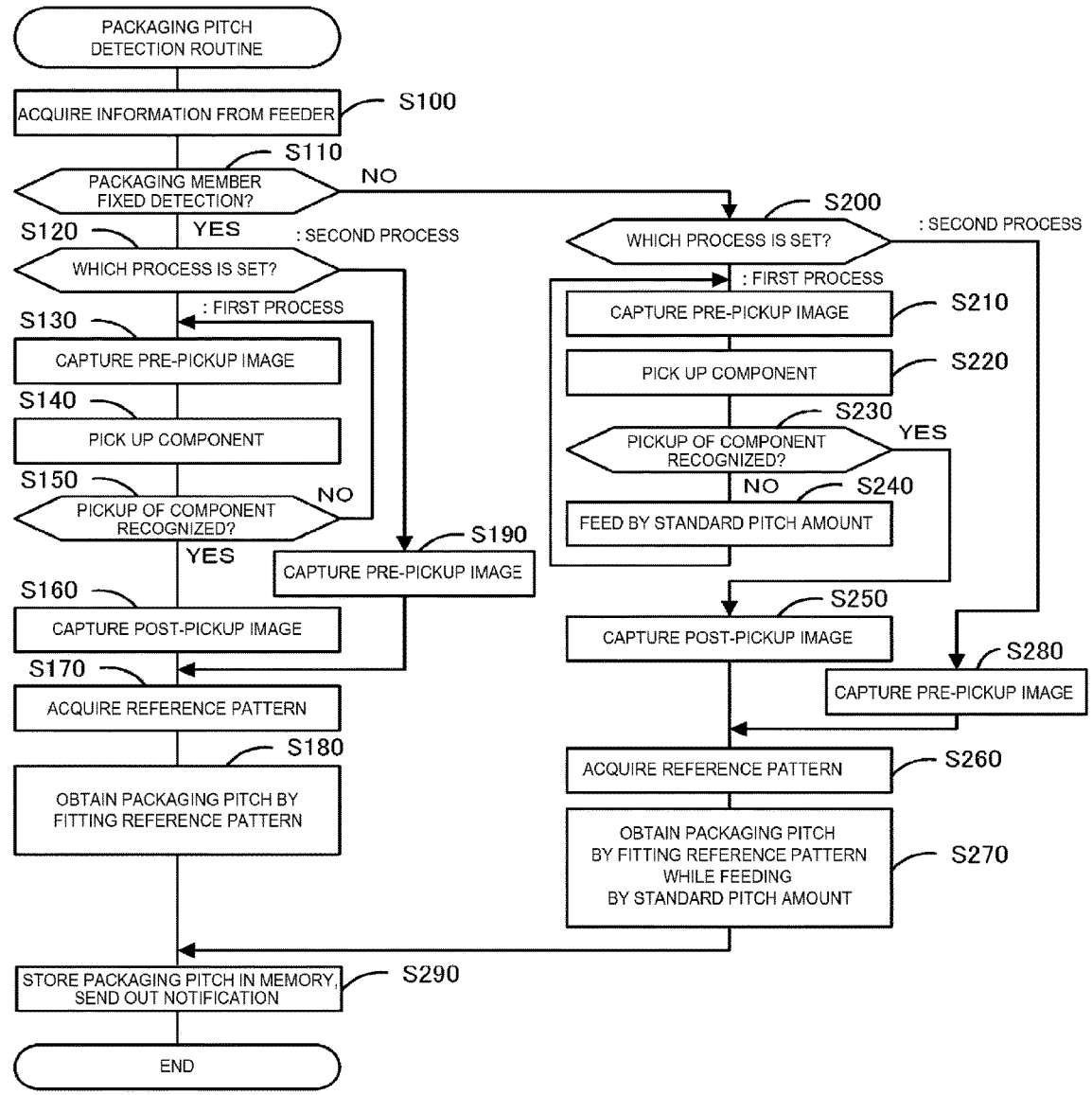
FIG. 3 A flowchart showing an example of a packaging pitch detection routine.
Figure 4A:
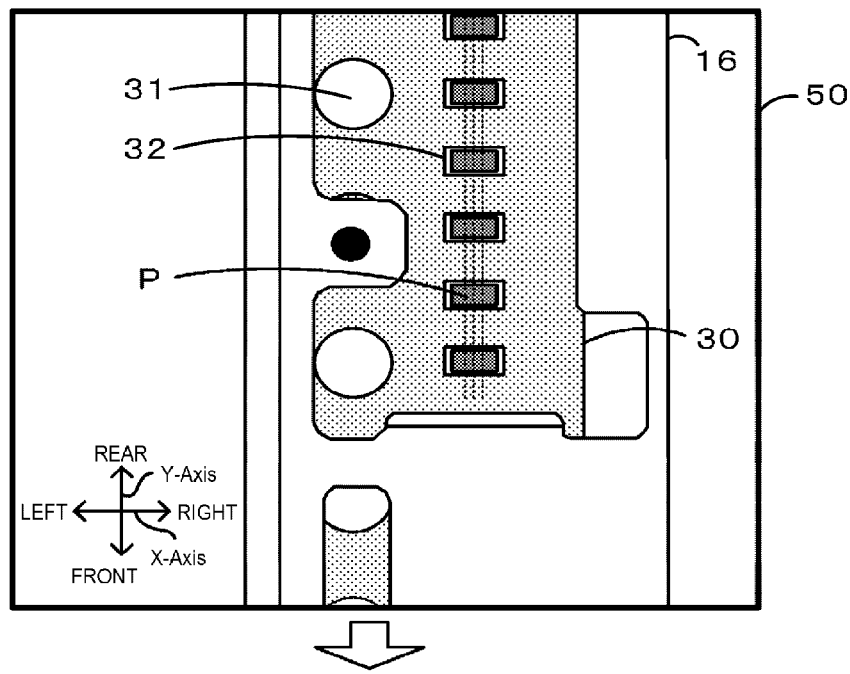
FIG. 4 A figure showing pre-pickup image 50 and post-pickup image 51,
FIG. 5 A figure showing reference pattern 54 being obtained without feeding out packaging member 30.
Figure 4B:
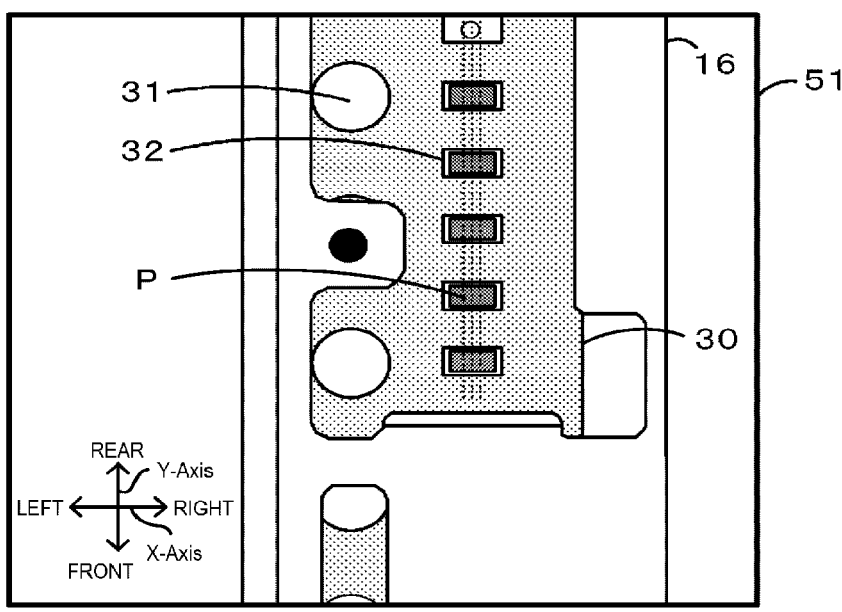
Figure 5A:
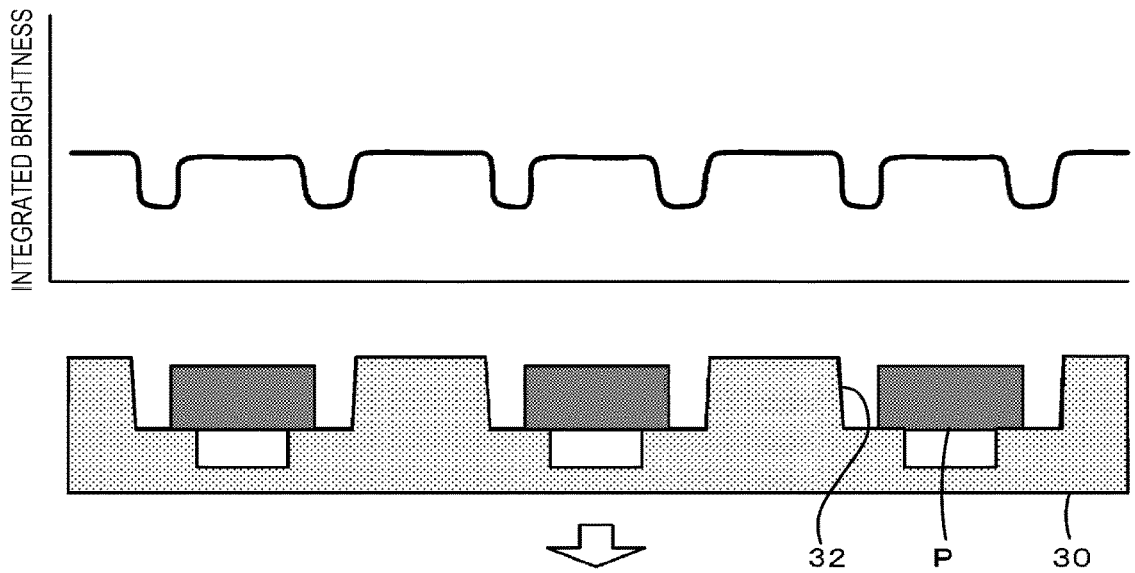
Figure 5B:
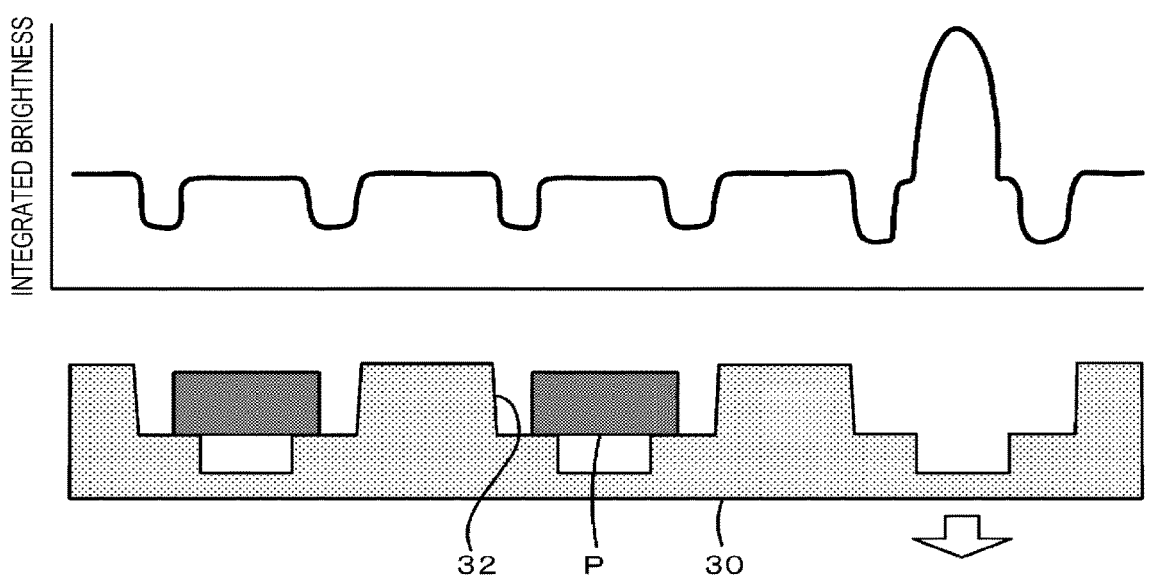
Figure 5C:
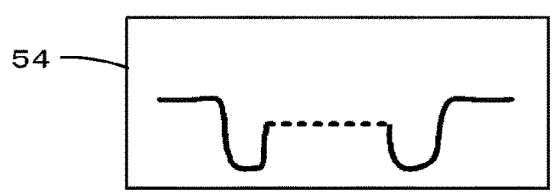
Figure 6A:
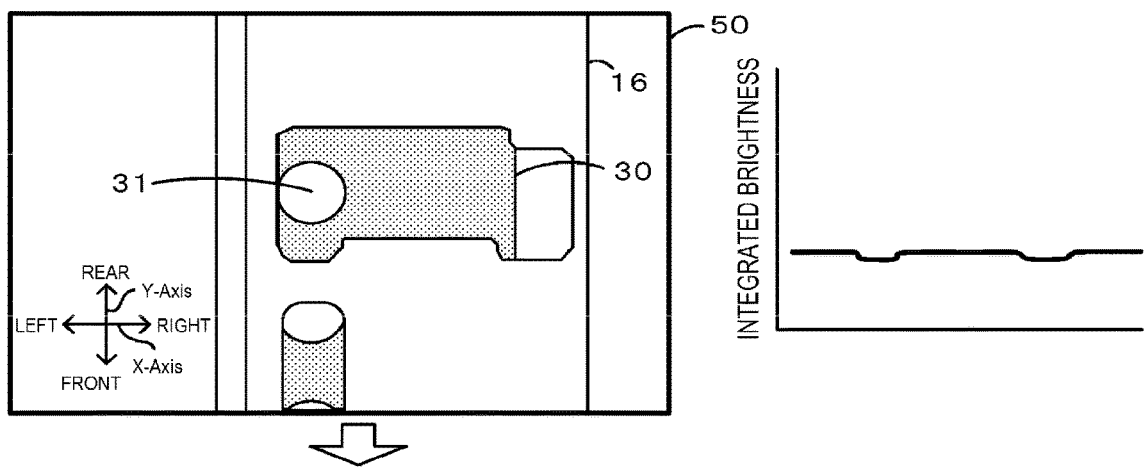
FIG. 6 A figure showing packaging member 30 being fed out and reference patterns obtained.
Figure 6B:
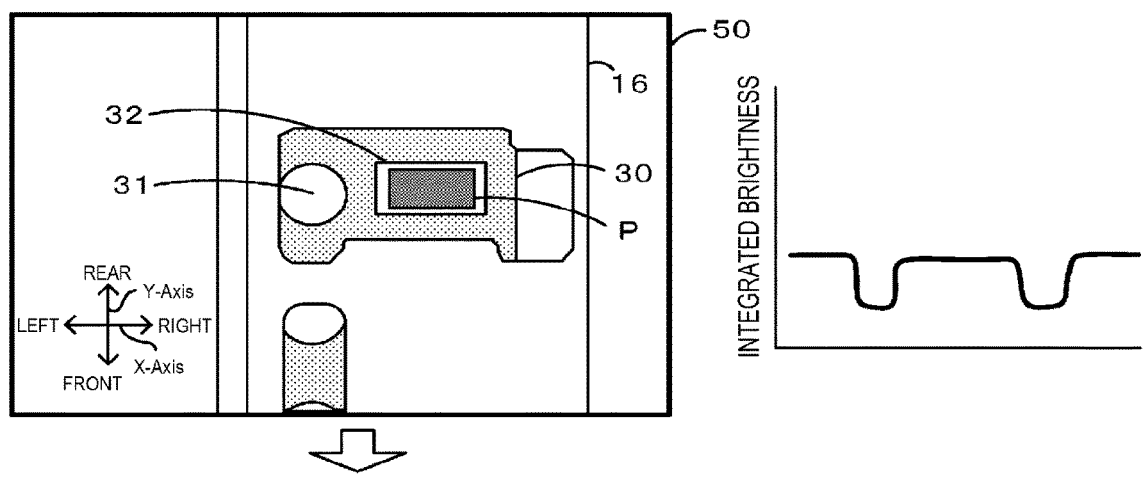
Figure 6C:
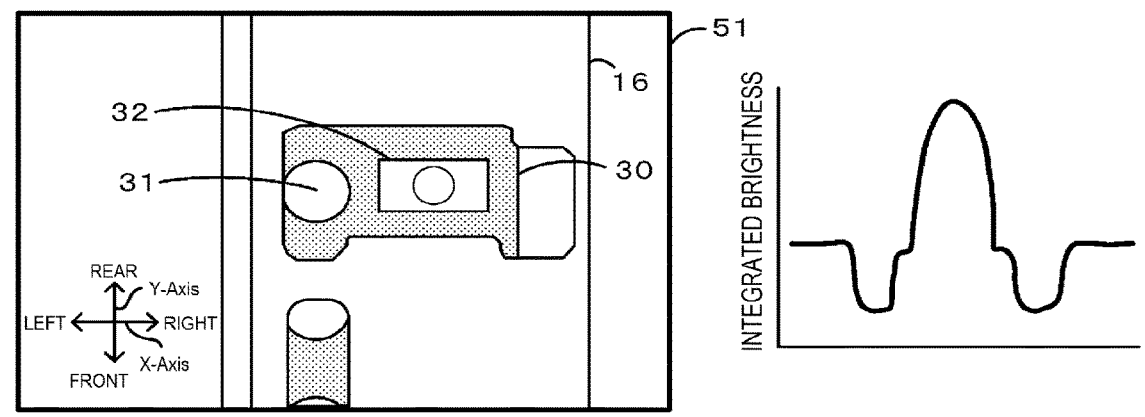

Next, the operation of mounting system 10 of the present embodiment configured as described above, particularly, the process of detecting the packaging pitch will be described, the packaging pitch being the interval between accommodating portions 32 in packaging member 30. FIG. 3 is a flowchart showing an example of a packaging-pitch detection routine executed by CPU 26 of control device 25. FIG. 4 is a figure showing pre-pickup image 50 of component P (FIG. 4A) and post-pickup image 51 of component P (FIG. 4B). FIG. 5 is a figure showing reference pattern 54 being obtained without feeding out packaging member 30, FIG. 5A is a view before picking up component P, FIG. 5B is a view after picking up component P, and FIG. 5C is a figure showing an example of reference pattern 54. In FIG. 5, cross-sectional side views of packaging member 30 are shown. FIG. 6 is a schematic figure showing packaging member 30 being fed out and a reference pattern being obtained, in which FIG. 6A is a pre-pickup image 50 in which accommodating portion 32 is not in the imaging area, FIG. 6B is pre-pickup image 50 of accommodating portion 32 accommodating component P, and FIG. 6C is post-pickup image 51 of accommodating portion 32 after component P has been picked up. When multiple accommodating portions 32 are included in one image captured with mark camera 23, mounting device 11 is set so that the packaging pitch is obtained by packaging member fixed detection in which packaging member 30 is not fed out, and when one accommodating portion 32 is included in one image, mounting device 11 is set so that the packaging pitch is obtained by packaging member feeding detection in which packaging member 30 is fed out. Further, in mounting device 11, either a first process for obtaining the packaging pitch using the images captured before and after the pickup of component P or a second process for obtaining the packaging pitch without picking up component P is executed by switching based on a predetermined setting.

A packaging-pitch detection routine is stored in storage section 27 and is executed by the instruction of an operator after feeder 16 is installed in component supply section 14. When this routine is executed, CPU 26 acquires the information stored in feeder 16 (S100). CPU 26 acquires, from feeder 16, identifiers for feeder 16, packaging member 30, and component P; the set feed amount of packaging member 30 (i.e., the packaging pitch); and the like. Next, CPU 26 determines whether the detection is the packaging member fixed detection based on the acquired data (S110). Based on the acquired type of feeder 16 and information regarding packaging member 30 described above, CPU 26 determines whether to perform the packaging member fixed detection or the packaging member feeding detection depending on whether multiple accommodating portions 32 are captured in one image.

When it is determined that multiple accommodation portions 32 are captured in one captured image for feeder 16, CPU 26 determines whether the set process for performing the packaging member fixed detection is the first process or the second process (S120). When the set process is the first process of obtaining the packaging pitch using images captured before and after picking up component P, CPU 26 moves mounting head 21 above feeder 16 and causes mark camera 23 to capture an image of packaging member 30 before picking up component P as pre-pickup image 50 (S130, see FIG. 4A). Next, CPU 26 causes mounting head 21 to pick up component P (S140), captures an image of mounting head 21 with part camera 17, and then recognizes whether component P has been picked up by mounting head 21 based on the captured image (S150). When a component is not recognized as having been picked up by mounting head 21, CPU 26 feeds out packaging member 30 by a minimum standard pitch, for example, and performs the processes of S130 to S150. Even when accommodating portion 32 is not at the pickup position immediately after feeder 16 is installed, as long as the process is repeated, mounting head 21 will be able to pick up component P. "Minimum standard pitch" may be the shortest pitch of the packaging interval of various packaging members 30 used in mounting device 11 (e.g., 1 mm or 2 mm, etc.).

When a component is recognized as having been picked up, CPU 26 moves mounting head 21 above feeder 16 and causes mark camera 23 to capture post-pickup image 51 of packaging member 30 after picking up component P (S160, see FIG. 4B). Next, CPU 26 acquires a reference pattern of packaging member 30 based on pre-pickup image 50 and post-pickup image 51 (S170). CPU 26, for example, as shown in FIG. 5, extracts the region of component P from the difference between pre-pickup image 50 and post-pickup image 51, with the region in the vicinity of component P being accommodating portion 32, and this pattern can be made the reference pattern. As shown in FIG. 5A, when the colors of component P and packaging member 30 are similar, it is possible that the region of the component will not be accurately extracted due to the brightness in the regions also being similar. In this first process, the region of component P is obtained accurately by picking up component P, making it possible to obtain an error-free reference pattern. Here, when acquiring the reference pattern, CPU 26 may acquire the reference pattern by integrating the brightness of multiple rows of pre-pickup image 50 and adding or multiplying the brightness of multiple rows of post-pickup image 51. As shown by the dotted line in FIG. 4, by integrating the brightness of multiple rows (e.g., 30 rows), if the brightness value of black is set to 30, the integrated value can go up to 900, making it possible to more accurately discriminate between regions even if the respective colors of those regions are similar. Subsequently, CPU 26 performs a fitting process of reference pattern 54 in the region of pre-pickup image 50 or post-pickup image 51 to obtain the packaging pitch (S180). CPU 26 obtains the packaging pitch from intervals of multiple regions, which match with the reference pattern, included in the captured image of packaging member 30. CPU 26, for example, may be used to perform the fitting of reference pattern 54 for each region of the integrated brightness shown in FIG. 5, In this manner, the packaging pitch of packaging member 30 can be obtained as an actual measurement value.

On the other hand, when the set process is the second process for obtaining the packaging pitch using only the image captured before component P is picked up in S120, CPU 26 causes mark camera 23 to capture pre-pickup image 50 (S190) and then obtains the reference pattern from pre-pickup image 50 in S170. CPU 26 acquires, for example, the brightness distribution of pickup positions in pre-pickup image 50 as a reference pattern. In the second process, since imaging processing is performed once and component P is not picked up, the processing time is shortened, but the accuracy is inferior to that in the first process. Mounting device 11 is configured to allow the user to select the first process or the second process after consideration of the advantages and disadvantages. After obtaining the reference pattern, CPU 26 obtains the packaging pitch by fitting the reference pattern in S180 in the same manner as described above.

On the other hand, in S110, when it is determined that only one accommodation portion 32 is captured in one captured image in feeder 16, CPU 26 determines, with the mode of detection being packaging member feeding detection, whether the set process is the first process or the second process (S200). In the following process, the same process as the above-described packaging member fixed detection is performed, and a specific description thereof is omitted. Next, when the set process is the first process, CPU 26 causes mark camera 23 to capture pre-pickup image 50 (see S210, FIG. 6A, and FIG. 6B). Next, CPU 26 causes mounting head 21 to pick up component P (S220) and recognizes whether component P has been picked up by mounting head 21 (S230). If the component is not recognized as having been picked up by mounting head 21, CPU 26 causes packaging member 30 to be fed out by a minimum standard pitch (S240) and performs the processes of S210 to S230. Even when accommodating portion 32 is not at the pickup position immediately after feeder 16 is installed, as long as the process is repeated, accommodating portion 32 will be fed to the pickup position, When a component is recognized as having been picked up, CPU 26 causes mark camera 23 to capture post-pickup image 51 (see S250, FIG. 6C). Next, CPU 26 obtains a reference pattern of packaging member 30 based on pre-pickup image 50 and post-pickup image 51 (S260). The reference pattern can be acquired by the same process as in S170. Subsequently, CPU 26 causes packaging member 30 to be fed by a minimum standard pitch, causes an image to be captured thereof, and performs a fitting process with the reference pattern to determine the packaging pitch (S270). CPU 26, after obtaining the reference pattern, repeats a process of feeding packaging member 30 by a minimum standard pitch amount, causing an image of packaging member 30 to be captured, and determining whether the reference pattern is included in the image captured, and if a region matching with the reference pattern is detected, obtains the packaging pitch from the amount fed up to the time of detection. In this manner, the packaging pitch of packaging member 30 can be obtained as an actual measurement value.

On the other hand, when the set process is the second process in S200, CPU 26 causes mark camera 23 to capture pre-pickup image 50 (S280) and acquire a reference pattern from pre-pickup image 50 in S260. CPU 26 obtains, for example, the brightness distribution of the pickup position in pre-pickup image 50 (FIG. 6B) as a reference pattern. After acquiring the reference pattern, CPU 26 obtains the packaging pitch by fitting the reference pattern in S270 in the same manner as described above.

Subsequently, CPU 26 stores the obtained packaging pitch, and when the packaging pitch differs from the packaging pitch set in feeder 16, informs the operator of the difference (S290) and ends the routine. CPU 26 may, for example, display messages and warnings on the display of operation panel 28. There are cases in which multiple kinds of packaging pitches are present in packaging member 30 in which components P are packaged. When mounting packaging member 30 in feeder 16, incorrect input of the packaging pitch may result in the loss of a large number of components during the mounting process. In mounting device 11, it is possible to avoid such component losses because the packaging pitch is automatically measured. An operator who has checked the contents of the notification may perform a process of changing the packaging pitch to the packaging pitch obtained by mounting device 11. Alternatively, CPU 26 may send a packaging pitch to feeder 16 for updating.

Mounting device 11 then feeds out packaging member 30 by a feed amount equal to the obtained packaging pitch in accordance with the placement sequence of components P included in the mounting-condition information, and performs a mounting process for picking up component P from packaging member 30 to mounting head 21.

Here, the correspondence between constituent elements of the present embodiment and constituent elements of the present disclosure will be specified. Mounting head 21 of the present embodiment corresponds to the mounting head of the present disclosure, mounting section 15 corresponds to the mounting section, feeder 16 corresponds to the feeding unit, mark camera 23 corresponds to the imaging section, CPU 26 corresponds to the control section, part camera 17 and control device 25 correspond to the recognition section, operation panel 28 corresponds to the notification section, control device 25 corresponds to the inspection device. In the present embodiment, an example of a detection device and a detection method of the present disclosure is also specified by describing the operation of mounting device 11.

In mounting device 11 of the present embodiment described above, a reference pattern of packaging member 30 in which components P are packaged is obtained based on pre-pickup image 50 captured of packaging member 30 before component P is picked up and post-pick image 51 captured of packaging member 30 after component P is picked up, and a packaging pitch is obtained based on this reference pattern. In mounting device 11, it is possible to detect the region of component P using pre-pickup image 50 and post-pickup image 51, and since it is possible to more reliably determine the packaging position of component P, the packaging pitch of component P can be more reliably obtained. Further, control device 25, after obtaining the reference pattern from pre-pickup image 50 and post-pickup image 51, obtains the packaging pitch from the interval of multiple regions included in the image captured of packaging member 30 which match with the reference pattern. In mounting device 11, for example, when multiple packaging positions of components P are included in one captured image, it is possible to more reliably determine the packaging pitch of component P using the captured image.

Further, control device 25, after obtaining the reference pattern, repeats a process of feeding packaging member 30 by a standard pitch amount, causing an image of packaging member 30 to be captured, and then determining whether the reference pattern is included in the image captured, and if a region matching with the reference pattern is detected, obtains the packaging pitch from the amount fed up to the time of detection. In mounting device 11, for example, when the packaging position of one component is included in one captured image, it is possible to detect the next packaging position by feeding out packaging member 30 by an amount equal to the standard pitch. In mounting device 11, it is possible to more reliably determine the packaging pitch of component P using one or more captured images taken after feeding out packaging member 30. Further, control device 25 obtains a reference pattern by integrating the brightness of multiple rows of post-pickup image 51 in addition to integrating the brightness of multiple rows of pre-pickup image 50, and integrates the brightness of multiple rows of the captured image to determine whether the reference pattern is included in the captured image. Due to the oftentimes similar color (e.g., black and gray) of packaging member 30, components P, packaging positions of components P, and the like, it may be difficult to discriminate between them, but in mounting device 11, by utilizing a method such as multiple exposures and integrating brightness of multiple rows, differences between them are made clear, thus making it possible to reliably obtain a packaging pitch of the component.

Further, control device 25 performs any one of a first process of obtaining the packaging pitch based on a reference pattern obtained from pre-pickup image 50 and post-pickup image 51, and a second process of obtaining the packaging pitch based on a reference pattern obtained from pre-pickup image 50 without using post-pickup image 51. In mounting device 11, any one of the first process which more reliably obtains the packaging pitch and the second process which simplifies the process can be performed. Furthermore, in mounting device 11, it is possible to reliably determine the packaging pitch of components because the picking up of component P by mounting head 21 is confirmed with part camera 17. Further, in mounting device 11, by notifying an operator, via operation panel 28 of the obtained packaging pitch, it is possible to perform the mounting process at an accurate packaging pitch. Further, control device 25, after determining the packaging pitch, feeds out packaging member 30 to feeder 16 by a feed amount equal to the packaging pitch, to pick up component P from packaging member 30 with mounting head 21. By more reliably determining the packaging pitch of component P in mounting device 11, it is possible to perform a more reliable mounting process.

It is to be understood that the present disclosure is not limited to the embodiments described above in any way, and may be implemented in various forms as long as the embodiments fall within the technical scope of the present disclosure.

For example, the embodiment described above is configured so that the second process is selectable, but the present disclosure is not particularly limited thereto, and a configuration in which there is only the first process is permitted. Even in such a mounting device, it is possible to more reliably determine the packaging pitch of component P. In the embodiment described above, the packaging member fixed detection and the packaging member feeding detection are switched and executed, but only one of them needed may be executed. In such a mounting device, the above-mentioned effects of the adopted mode can be obtained.

In the embodiment described above, the reference pattern is acquired by integrating the brightness of multiple rows, but the present disclosure is not particularly limited thereto, and the brightness of multiple rows need not be integrated. Since the region of component P can be determined when the color tones of component P and packaging member 30 are different, the packaging pitch of component P can be more reliably determined.

In the embodiment described above, the picking up of component P is recognized by part camera 17, but the present disclosure is not particularly limited thereto as long as component P having been picked up from packaging member 30 can be detected, and picking up of component P may be recognized, for example, by an imaging section that captures an image from the side of mounting head 21. Furthermore, in the case in which the imaging section configured to capture an image from the side of mounting head 21 is provided on mounting head 21 itself, recognition of the pickup of component P by mounting head 21 can be performed quickly because mounting head 21 need not be moved from component supply section 14 to part camera 17 or an imaging section provided to some other external portion of mounting head 21. Alternatively, mounting device 11 may omit the pickup recognition of component P. For example, the pickup of component P may be recognized from a difference between pre-pickup image 50 and post-pickup image 51.

In the embodiment described above, the operator is notified of the obtained packaging pitch via operation panel 28, but this may be omitted. Mounting device 11 may also automatically update the packaging pitch of feeder 16 to the correct value. In this mounting device 11, the mounting process can be executed more reliably.

In the embodiment described above, the present disclosure has been described as mounting device 11, but a control method of mounting device 11 or a program for executing the control method may be used. Alternatively, the present disclosure may be a detection device comprising control device 25, or may be a detection method or a program thereof. This detection device may be provided in host PC 40, for example, or may be a device dedicated to inspecting packaging member 30.

Here, in the mounting device of the present disclosure, the control section, after obtaining the reference pattern from the pre-pickup image and the post-pickup image, may obtain the packaging pitch from the interval of multiple regions in the image captured of the packaging member which match with the reference pattern. In this mounting device, for example, when multiple packaging positions of components are included in one captured image, it is possible to more reliably determine the packaging pitch of the component using the captured image.

Alternatively, in the mounting device of the present disclosure, the control section, after obtaining the reference pattern, may repeat a process of feeding the packaging member by a standard pitch amount, causing an image of the packaging member to be captured, and determining whether the reference pattern is included in the image captured, and if a region matching with the reference pattern is detected, obtain the packaging pitch from the amount fed up to the time of detection. In this mounting device, for example, when the packaging position of one component is included in one captured image, it is possible to detect the next packaging position by feeding out the packaging member by an interval equal to the standard pitch. Therefore, in this mounting device, it is possible to more reliably determine the packaging pitch of a component by feeding out the packaging member and using one or more captured images. Here, the "standard pitch" may be made the shortest pitch between packaging intervals of various packaging members used in mounting devices.

In the mounting device of the present disclosure, the control section may acquire the reference pattern by integrating the brightness of multiple rows of the pre-pickup image in addition to integrating the brightness of multiple rows of the post-pickup image, integrate the brightness of multiple rows in the captured image, and then determine whether the reference pattern is included in the captured image. Due to the oftentimes similar color (e.g., black and gray) of the packaging member, components, packaging positions of the components, and the like, it may be difficult to discriminate between them, but in this mounting device, by utilizing a method such as multiple exposures and integrating brightness of multiple rows, differences between them are made clear, thus making it possible to reliably obtain a packaging pitch of the component.

In the mounting device of the present disclosure, the control section may perform any one of a first process of obtaining the packaging pitch based on a reference pattern obtained from the pre-pickup image and the post-pickup image, and a second process of obtaining the packaging pitch based on a reference pattern obtained from the pre-pickup image without using the post-pickup image. In this mounting device, it is possible to perform any one of the first process which more reliably obtains the packaging pitch and the second process which simplifies the process.

The mounting device of the present disclosure includes a recognition section configured to recognize a component picked up by the mounting head, wherein the control section may obtain a reference pattern, as a post-pickup image, after picking up of the component is confirmed by the recognition section. In this mounting device, since picking up of the component by the mounting head is confirmed, it is possible to further reliably obtain the packaging pitch of components.

The mounting device of the present disclosure may include a notification section for reporting information to an operator, and the control section may cause the notification section to notify the operator of the obtained packaging pitch. In this packaging device, by notifying the operator of the obtained packaging pitch, it is possible to perform the packaging process at an accurate packaging pitch, In the mounting device of the present disclosure, the control section, after determining the packaging pitch, causes the feeding unit to feed out the packaging member by a feed amount equal to the packaging pitch and causes the mounting head to pick up the component from the packaging member. In this mounting device, it is possible to perform a more reliable mounting process by more reliably obtaining the packaging pitch of the components.

The detection device disclosed herein includes a mounting section on which a feeding unit is installed to supply components by feeding a packaging member where the components are packaged at predetermined intervals: a mounting head configured to pick up a component from the packaging member, and an imaging section configured to image the packaging member, wherein the detection device includes a control section configured to obtain a packaging pitch based on a reference pattern of the packaging member with the packaged components, the reference pattern being acquired based on a pre-pickup image which is a captured image of the packaging member before picking up a component, and a post-pickup image which is a captured image of the packaging member after picking up the component.

The detection device, similar to the mounting device described above, can more reliably obtain the packaging pitch of the component since the detection device can detect the region of the component using a pre-pickup image and a post-pickup image. In this detection method, processes to be performed by any of the mounting devices described above may be added, or the configuration of any of the mounting devices described above may be adopted.

The detection method disclosed herein includes the mounting device comprising: a mounting section on which a feeding unit is installed to supply components by feeding a packaging member where the components are packaged at predetermined intervals; a mounting head configured to pick up a component from the packaging member; an imaging section configured to image the packaging member; and wherein the detection method comprises: (a) a step of acquiring a reference pattern of the packaging member with the packaged components, based on a pre-pickup image which is a captured image of the packaging member before picking up a component, and a post-pickup image which is a captured image of the packaging member after picking up the component, and (b) a step of obtaining a packaging pitch based on the acquired reference pattern.

This detection method, as with the mounting device described above, can more reliably determine the packaging pitch of the component since the detection device can detect the region of the component using a pre-pickup image and a post-pickup image. In this detection method, steps for performing the processes of any of the mounting devices described above may be added, or the configuration of any of the mounting devices described above may be adopted.

INDUSTRIAL APPLICABILITY

The mounting device, the detection device, and the detection method of the present disclosure can be used in the field of electronic component mounting.

REFERENCE SIGNS LIST

10 Mounting system, 11 Mounting device, 12 Board processing section, 13 Mounting section, 14 Component supply section, 15 Mounting section, 16 Feeder, 17 Part camera, 20 Head moving section, 21 Mounting head, 22 Suction nozzle, 23 Mark camera, 25 Control device, 26 CPU, 27 Storage section, 28 Operation panel, 30 Packaging member, 31 Feed hole, 32 Accommodating portion, 40 Host PC, 50 Pre-pickup image, 51 Post-pickup image, 54 Reference pattern, P Component, S Board.

The invention claimed is:

1. A mounting device, comprising:
a mounting section on which a feeding unit is installed to supply components by feeding a packaging member where the components are packaged in a packaging pitch at predetermined intervals;
a mounting head configured to pick up a component from the packaging member;
a camera configured to image the packaging member; and
a control device including a processor configured to
capture, with the camera, a first pre-pickup image of the packaging member before picking up the component from the packaging member with the mounting head,
capture, with the camera, a second post-pickup image of the packaging member after picking up the component from the packaging member with the mounting head,
acquire a reference pattern of the packaging member based on the first pre-pickup image and the second post-pickup image, and
obtain the packaging pitch of the packaging member by fitting the reference pattern in a region of the first pre-pickup image or the second post-pickup image.

2. The mounting device of claim 1, wherein the control device, after obtaining the reference pattern from the first pre-pickup image and the second post-pickup image, is configured to obtain the packaging pitch from intervals of multiple regions of the packaging member which match with the reference pattern, the multiple regions of the packaging member being included in the first pre-pickup image or the second post-pickup image.

3. The mounting device of claim 1, wherein the control device, after obtaining the reference pattern, is configured to repeat a process of feeding the packaging member by a standard pitch amount, causing an image of the packaging member to be captured, and determining whether the reference pattern is included in the image captured, and if a region matching with the reference pattern is detected, obtain the packaging pitch from the amount fed up to the time of detection.

4. The mounting device of claim 1, wherein the control device is configured to acquire the reference pattern by integrating a brightness of multiple rows of the first pre-pickup image, integrating a brightness of multiple rows of the second post-pickup image, and then determining whether the reference pattern is included in the first pre-pickup image or the second post-pickup image.

5. The mounting device of claim 1, wherein the control device is configured to perform any one of a first process of obtaining the packaging pitch based on a reference pattern obtained from the first pre-pickup image and the second post-pickup image, and a second process of obtaining the packaging pitch based on a reference pattern obtained from the first pre-pickup image without using the second post-pickup image.

6. The mounting device of claim 1, wherein the control device is further configured to
recognize the component picked up by the mounting head, and
obtain the reference pattern after the component is recognized to have been picked up.

7. The mounting device of claim 1, further comprising:
an operation panel configured to report information to an operator;
wherein the control device is configured to cause the operation panel to report the obtained packaging pitch to the operator.

8. The mounting device of claim 1, wherein the control device, after determining the packing pitch, is configured to control the feeding unit to feed out the packaging member by a feed amount equal to the packaging pitch and control the mounting head to pick up a component from the packaging member.

9. A detection device used in a mounting device, the mounting device comprising: a mounting section on which a feeding unit is installed to supply components by feeding a packaging member where the components are packaged in a packaging pitch at predetermined intervals; a mounting head configured to pick up a component from the packaging member, and a camera configured to image the packaging member, the detection device comprising:
a control device including a processor configured to
capture, with the camera, a first pre-pickup image of the packaging member before picking up the component from the packaging member with the mounting head,
capture, with the camera, a second post-pickup image of the packaging member after picking up the component from the packaging member with the mounting head,
acquire a reference pattern of the packaging member based on the first pre-pickup image and the second post-pickup image, and
obtain the packaging pitch of the packaging member by fitting the reference pattern in a region of the first pre-pickup image or the second post-pickup image.

10. A detection method used in a mounting device, the mounting device comprising: a mounting section on which a feeding unit is installed to supply components by feeding a packaging member where the components are packaged in a packaging pitch at predetermined intervals; a mounting head configured to pick up a component from the packaging member; and a camera configured to image the packaging member, the detection method comprising:
capturing, with the camera, a first pre-pickup image of the packaging member before picking up the component from the packaging member with the mounting head:

capturing, with the camera, a second post-pickup image of the packaging member after picking up the component from the packaging member with the mounting head;

acquiring a reference pattern of the packaging member with the packaged components, based on the first pre-pickup image and the second post-pickup image; and obtaining the packaging pitch by fitting the acquired reference pattern in a region of the first pre-pickup image or the second post-pickup image.

* * * * *